United States Patent
Kraus et al.

(10) Patent No.: US 7,053,489 B2
(45) Date of Patent: May 30, 2006

(54) ARRANGEMENT WITH A SEMICONDUCTOR CHIP AND SUPPORT THEREFORE AND METHOD FOR A BONDED WIRE CONNECTION

(75) Inventors: Sieglinde Kraus, Regensburg (DE); Gunther Rauscher, Künzing (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/039,284

(22) Filed: Jan. 20, 2005

(65) Prior Publication Data

US 2005/0127497 A1     Jun. 16, 2005

Related U.S. Application Data

(63) Continuation of application No. PCT/DE03/02465, filed on Jul. 22, 2003.

(30) Foreign Application Priority Data

Jul. 24, 2002   (DE) ................... 10233607

(51) Int. Cl.
  *H01L 23/48* (2006.01)
(52) U.S. Cl. ..................... 257/780; 257/734
(58) Field of Classification Search ............... 257/780, 257/781, 782, 783, 784, 785, 786; 438/614, 438/612, 617, 666, 118
  See application file for complete search history.

(56) References Cited

U.S. PATENT DOCUMENTS

| | | | |
|---|---|---|---|
| 4,868,634 A * | 9/1989 | Ishida et al. | |
| 5,258,647 A * | 11/1993 | Wojnarowski et al. | |
| 5,283,081 A * | 2/1994 | Kata et al. | |
| 5,874,354 A | 2/1999 | Heitzer et al. | 438/612 |
| 5,902,758 A * | 5/1999 | Hazeyama et al. | |
| 6,079,610 A | 6/2000 | Maeda et al. | 228/180.5 |
| 6,084,295 A * | 7/2000 | Horiuchi et al. | |
| 6,111,306 A | 8/2000 | Kawahara et al. | 257/666 |
| 6,133,072 A | 10/2000 | Fjelstad | 438/128 |
| 2002/0041027 A1* | 4/2002 | Sugizaki | |
| 2002/0072214 A1 | 6/2002 | Yuzawa et al. | 438/613 |

FOREIGN PATENT DOCUMENTS

| | | |
|---|---|---|
| DE | 4318061 A1 | 1/1995 |
| GB | 2370413 A | 6/2002 |
| JP | 60136356 A | 7/1985 |
| JP | 9330943 | 12/1997 |
| JP | 200068309 | 3/2000 |
| JP | 2000323514 A | 11/2000 |
| JP | 2002118198 A | 4/2002 |
| WO | 99/44782 | 10/1999 |

\* cited by examiner

OTHER PUBLICATIONS

PCT International Search Report Application No. PCT/DE03/02465, 3 pages (English), Mailed Nov. 10, 2003.

*Primary Examiner*—Nathan J. Flynn
*Assistant Examiner*—Kevin Quinto
(74) *Attorney, Agent, or Firm*—Baker Botts L.L.P.

(57) ABSTRACT

The invention relates to an assembly comprising a support, which bears a semiconductor chip that is connected to a metallized surface on the rear of the support by means of a through-plating. A first nail head contact, from which the connection wire has been separated, is formed on the through-plating. A second nail head contact is formed on a connection pad of the semiconductor chip. The wire that connects the semiconductor to the through-plating runs from said second nail head contact to the first nail head contact and is connected to the latter by means of a wedge contact.

6 Claims, 1 Drawing Sheet

ARRANGEMENT WITH A SEMICONDUCTOR CHIP AND SUPPORT THEREFORE AND METHOD FOR A BONDED WIRE CONNECTION

CROSS-REFERENCE TO RELATED APPLICATION OR PRIORITY

This application is a continuation of co-pending International Application No. PCT/DE03/02465 filed Jul. 22, 2003 which designates the United States, and claims priority to German application number DE10233607.5 filed Jul. 24, 2002.

FIELD OF THE INVENTION

The invention is directed to an arrangement with a semiconductor chip, a support with through-plating, and a wire connecting a contact pad of the semiconductor chip to the through-plating and method for producing such an arrangement.

The invention relates to an arrangement with a semiconductor chip and a support provided with a contact point as well as a wire connecting a contact pad of the semiconductor chip to the contact point, a first nail head contact being formed on said contact point, the first end of the wire being connected to a second nail head contact with the contact pad of the semiconductor chip and the second end of the wire being connected by means of a wedge contact to the first nail head contact. The invention also relates to a method for producing such an arrangement.

BACKGROUND OF THE INVENTION

An arrangement and a method are known from JP 2000-323514 A that claims to solve the problem of producing reliable bonded contacts, in particular wedge contacts, on circuit board conductors made of materials that do not connect easily to gold. Further areas of application do not emerge from this document.

SUMMARY OF THE INVENTION

The object of the invention is to allow the simplest and most cost-effective possible, yet nevertheless reliable connection between a wire, in particular a gold or aluminum wire, and a support surface, which only has a small degree of metallization at the site to be bonded.

The object is achieved by the following arrangement: a semiconductor chip, and a support, said support having a contact point and a wire having first and second ends, said wire connecting a contact pad of the chip to said contact point, said contact point having a first nail head contact formed thereon, the first end of the wire connected to a second nail head contact with the contact pad of the chip, the second end of the wire connected via a wedge contact to the first nail head contact, wherein the contact point comprises a through-plating in the support and the first nail head contact is applied directly to the support surface at the site of the through-plating without further surface metallization. The object is achieved by the following method: forming a first nail head contact directly on the support surface at the site of the through-plating without further metallization using the capillary of a bonding tool, separating the wire from the first nail head contact, forming a second nail head contact on the contact pad of the semiconductor chip using the capillary of the bonding tool, passing the wire to the first nail head contact, and forming a wedge contact with the end of the wire on the first nail head contact using the capillary of the bonding tool.

According to the principle of the invention, a nail head contact is applied directly to a support surface at the site of the through-plating, without further metallization being present on the surface. Only the hole through the support to form the through-plating is metallized. Affixing the nail head contact to the surface of the support at the site of said hole allows a sufficiently good connection with the metallization in the hole so that the wedge contact affixed to the nail head contact allows a connection to be made with the other surface of the support or with a metal layer between two insulating support coatings. The first nail head contact therefore replaces a contact pad on the support according to the invention. This advantageously avoids the need for an expensive substrate surface; the circuit can be shrunk.

A further advantage of the inventive arrangement or inventive method is that by dispensing with the need for the usual bonded contact areas on the support surface, one step of the process can be eliminated in the production of circuit board conductors on the support surface. This reduces costs as the gold paste hitherto generally used is no longer required.

In a development of the invention the support is to be configured with a ceramic material. Alternatively the support can also be a printed circuit board. The support can be made from one insulating layer, so that the through-plating extends from one support surface to the other, or it can comprise two or a plurality of insulating layers, metallization in the form of lines and/or frame surfaces being arranged between the layers with the through-plating only extending to this intermediate metallization in some places at least.

BRIEF DESCRIPTION OF THE DRAWING

The invention is described in more detail below based on an exemplary embodiment with reference to a FIG. 1, in which.

DETAILED DESCRIPTION OF EMBODIMENTS

Figure 1:
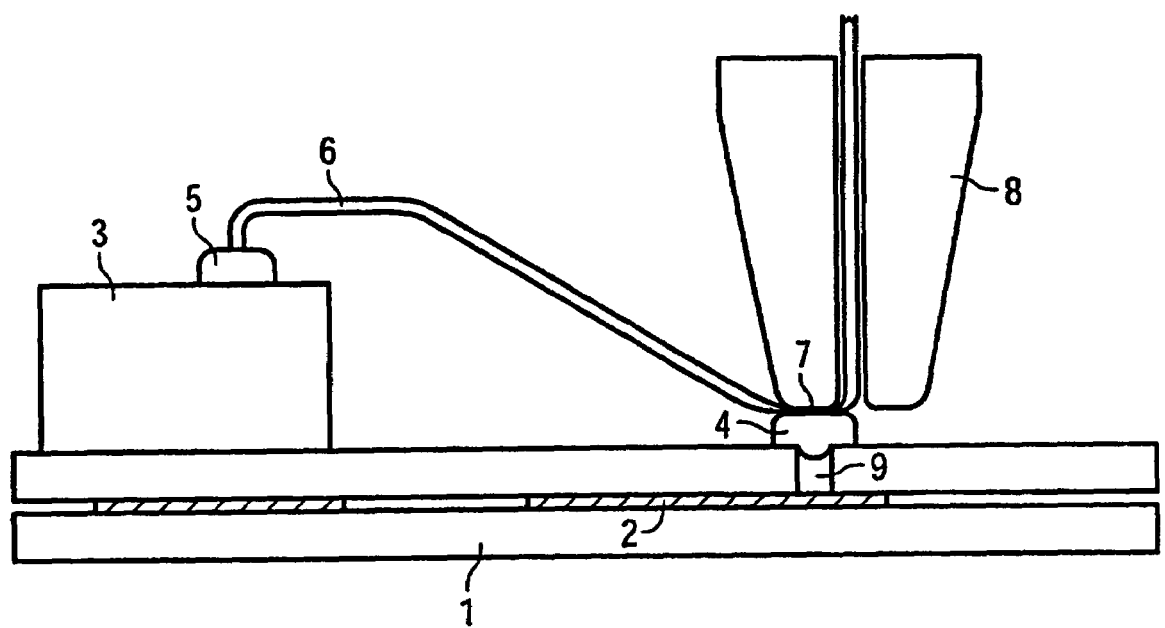
FIG. 1 shows an inventive arrangement.

FIG. 1 shows a support 1 with two insulating coatings, between which metallized surfaces and/or circuit board conductors 2 are arranged. A semiconductor chip 3 is arranged on one surface of the support 1. Through-plating 9, by means of which contact can be made with the metallized surface or circuit board conductor 2, passes through the support layer, on which the semiconductor chip 3 is arranged. According to the invention no contact pad is provided on the support surface but a first nail head contact 4 is applied, from which the wire has been separated. On a contact pad (not shown) of the semiconductor chip 3 a second nail head contact 5 is produced from which the wire 6 connecting the semiconductor chip 3 to the through-plating 9 runs to the first nail head contact 4 and is connected to this there by means of a wedge contact 7. In the example shown the first nail head contact 4 is pushed to some degree into the hole in the support layer of the through-plating 9 so that there is good contact with the metallization of the hole.

The invention is not restricted to use with multi-layer supports with intermediate metallization but can also be used on single-layer supports with metallized backs.

In FIG. 1 the capillary 8 of the bonding tool is also shown to clarify the inventive method.

What we claim is:

1. An arrangement comprising: a semiconductor chip, and a support, said support having a contact point and a wire having first and second ends, said wire connecting a contact pad of the chip to said contact point, said contact point having a first nail head contact formed thereon, the first end of the wire connected via a second nail head contact with the contact pad of the chip, the second end of the wire connected via a wedge contact to the first nail head contact, wherein the contact point comprises a through-plating in the support and the first nail head contact is applied directly to the support surface at the site of the through-plating without further surface metallization.

2. An arrangement according to claim 1, wherein the support is formed using a ceramic material.

3. An arrangement according to claim 1, wherein the support is formed using a multi-layer ceramic material and the through-plating connects one surface of the support to metallization between two ceramic layers.

4. An arrangement according to claim 1, wherein the support is a PC board.

5. An arrangement according to claim 1, wherein the support is formed using a multi-layer PC board and the through-plating connects one surface of the support to metallization between two PC board layers.

6. A method for the electrical connection of a contact pad of a semiconductor chip to through-plating on a support, said method comprising the following steps:

forming a first nail head contact directly on the support surface at the site of the through-plating without further metallization using the capillary of a bonding tool, separating the wire from the first nail head contact, forming a second nail head contact on the contact pad of the semiconductor chip using the capillary of the bonding tool, passing the wire to the first nail head contact, and forming a wedge contact with the end of the wire on the first nail head contact using the capillary of the bonding tool.

* * * * *